United States Patent
Zundel et al.

(10) Patent No.: US 7,737,521 B2
(45) Date of Patent: Jun. 15, 2010

(54) FIELD EFFECT POWER TRANSISTOR

(75) Inventors: Markus Zundel, Egmating (DE); Norbert Krischke, Munich (DE)

(73) Assignee: Infineon Technologies AG, Neubiberg (DE)

( * ) Notice: Subject to any disclaimer, the term of this patent is extended or adjusted under 35 U.S.C. 154(b) by 457 days.

(21) Appl. No.: 11/118,609

(22) Filed: Apr. 29, 2005

(65) Prior Publication Data

US 2005/0258464 A1 Nov. 24, 2005

(30) Foreign Application Priority Data

Apr. 30, 2004 (DE) ............... 10 2004 021 393

(51) Int. Cl.
*H01L 31/058* (2006.01)
(52) U.S. Cl. .................. 257/469; 257/470; 257/E23.08
(58) Field of Classification Search ......... 257/330–334, 257/452, 483, 467, 469, 470, E23.08
See application file for complete search history.

(56) References Cited

U.S. PATENT DOCUMENTS

| | | | |
|---|---|---|---|
| 5,095,343 A | 3/1992 | Klodzinski et al. | |
| 5,642,252 A | 6/1997 | Sakamoto et al. | |
| 6,144,085 A | 11/2000 | Barker | |
| 6,222,232 B1 | 4/2001 | Magri' et al. | |
| 6,806,533 B2 | 10/2004 | Henninger et al. | |
| 2004/0113179 A1* | 6/2004 | Pfirsch et al. ............... 257/213 | |

* cited by examiner

*Primary Examiner*—Wael Fahmy
*Assistant Examiner*—Abul Kalam
(74) *Attorney, Agent, or Firm*—Dicke, Dillig & Czaja, PLLC

(57) ABSTRACT

A power transistor is disclosed. In one embodiment, the power transistor has a cell array including a semiconductor body having a plurality of transistor cells with gate electrodes and with body and source electrode regions and at least one temperature sensing device integrated in the semiconductor body. The temperature sensing device is formed in a selected sense zone within the cell array, and the transistor cells lying in at least one zone of the cell array that is directly adjacent to the sense zone have an increased W/L ratio of their channel width (W) to their channel length (L) compared with the other transistor cells of the cell array.

11 Claims, 8 Drawing Sheets

Detail X

Schnitt s-s'

FIELD EFFECT POWER TRANSISTOR

CROSS-REFERENCE TO RELATED APPLICATIONS

This Utility Patent Application claims priority to German Patent Application No. DE 10 2004 021 393.3, filed on Apr. 30, 2004, which is incorporated herein by reference.

FIELD OF THE INVENTION

The invention relates to a field effect power transistor having a cell array comprising a multiplicity of transistor cells with gate electrodes and with body and source electrode regions and at least one temperature and/or current sensing device integrated in the semiconductor body.

BACKGROUND

Previous DMOS transistors have a cell array formed as homogeneously as possible. Since slight manufacturing fluctuations are always present, however, the cells of a large cell array are never perfectly identical. This has the effect that in operating states in which instances of current splitting can occur, such as, for example, in applications in linear controllers (SOA area) or in the case of avalanche effects (switch-on of the parasitic bipolar transistor or temperature increase up to intrinsic conduction), the most unfavorable (weakest) cells always form the current filament in a very locally delimited manner. In this case, the precise location of the occurrence of the weakest cell or of the current filament is not predictable and is thus statistically randomly distributed in the large cell array.

In order to form an overload protection for power transistors, previous concepts provide temperature or current sensors positioned at the edge or centrally in the cell array of the power transistor. Since, in most planar components, for example diodes or bipolar transistors of temperature sensing devices, both fully blocking edge terminations of the power transistor cell array and of the temperature sensing structure and an additional guard ring are necessary in order that the transistor cell array and the temperature sensing structure are not coupled electrically but rather only thermally. The customary temperature sensing device and the cell array in which the heat is generated are usually at a distance of approximately 70 to 100 µm from one another. This has the consequence that a large temperature gradient builds up over this distance and, as a result, rather than the true temperature in the cell array, a significantly lower temperature is detected in the temperature sensing device. This in turn frequently leads to delayed turn-off, so that the component is either already totally destroyed or incurs damage leading to reliability problems.

In order to improve this situation, DE 38 31 012 A1 proposes positioning a polysilicon resistor as temperature sensing device as centrally as possible in the cell array. Proximity to the heat source is directly afforded here. However, the polysilicon resistor, if it is formed in a trench, is subject to large manufacturing fluctuations in the region of approximately ±30%, so that it is necessary here to work with a reference polysilicon resistor in the edge region of the chip. This requires additional space, causes further costs and can also only ever detect relative changes in temperature between chip edge and cell array. If operating conditions are present in which heat the cell array relatively slowly (for example over several 100 µs), then the chip edge is also no longer at the cold reference temperature, but is also already heated to an unknown extent. This results in great uncertainty with regard to the "true" temperature in the cell array.

By virtue of the instances of current splitting described above, a temperature sensor positioned in the cell array always has the major disadvantage that a current filament that occurs randomly somewhere in an unpredictable manner in the cell array is detected only with a very great delay or is not detected at all by said temperature sensor, as a result of which the component can no longer be turned off in a timely manner and is destroyed.

The present invention provides an effective overload protection for field effect power transistors which can very rapidly detect the reaching of a critical temperature/of a critical current intensity, so that the power transistor can be turned off in a timely manner prior to its thermal self-destruction, even when the potential location of overheating (current splitting) is inhomogeneous and occurs statistically in the cell array.

SUMMARY

Embodiments of the invention provide a power transistor. In one embodiment, the invention provides a field effect power transistor the power transistor includes a cell array including a semiconductor body having a plurality of transistor cells with gate electrodes and with body and source electrode regions. The power transistor includes at least one temperature sensing device integrated in the semiconductor body, wherein the temperature sensing device is formed in a selected sense zone within the cell array, and the transistor cells lying in at least one zone of the cell array that is directly adjacent to the sense zone have an increased W/L ratio of their channel width (W) to their channel length (L) compared with the other transistor cells of the cell array.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
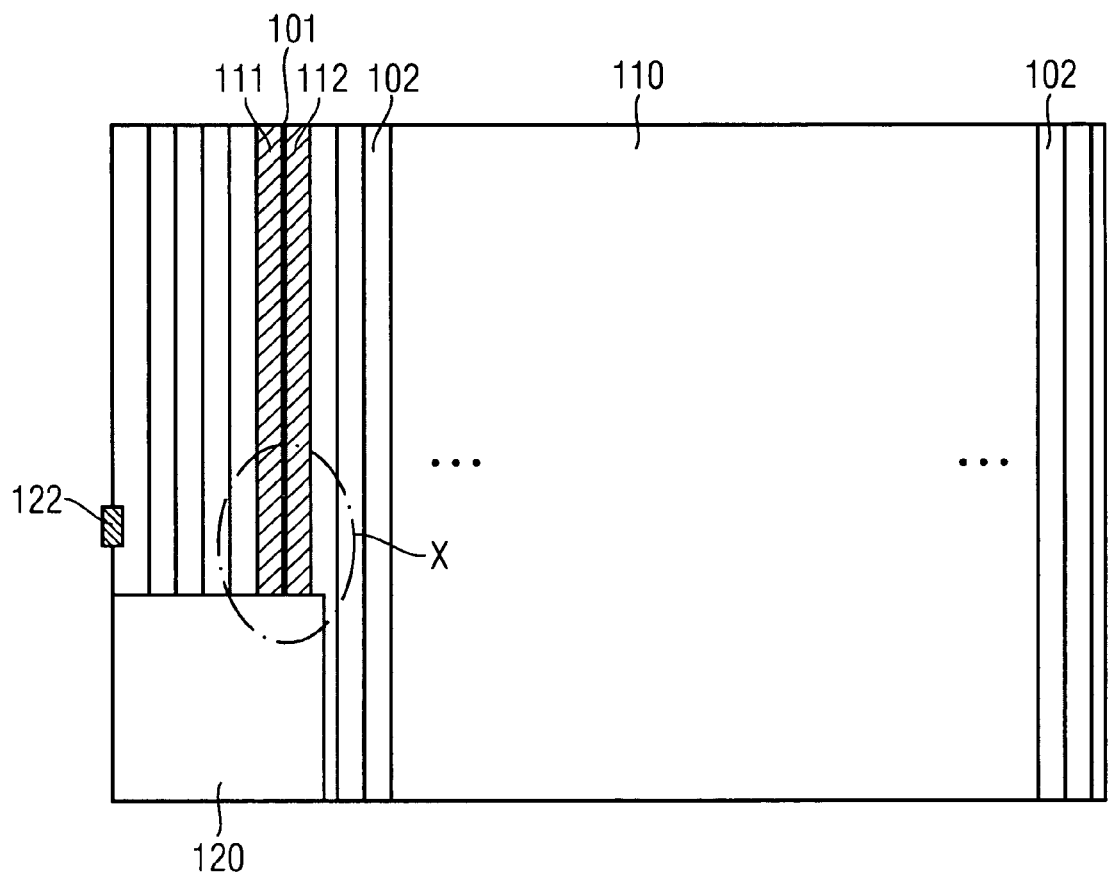
FIG. 1 illustrates one embodiment of a schematic plan view of a cell array of a field effect power transistor with a temperature or current sensing device arranged in a sense trench in proximity to the gate terminal pad in a manner tending in the direction toward the center of the chip, cell array strips that are directly adjacent to the sense trench on the right and on the left being embodied with transistor cells with an increased W/L ratio.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, a field effect power transistor according to the invention is characterized by the fact that the temperature and/or current sensing device is formed in a selected sense zone within the cell array, and the transistor cells lying in at least one zone of the cell array that is directly adjacent to the sense zone have an increased W/L ratio of their channel width W to their channel length L compared with the other transistor cells of the cell array.

Consequently, the invention provides for positioning the potential current filaments by means of targeted layouts or process interventions directly in the vicinity of the temperature sensing or current sensing device. This is done by means of the increased (compared with the other transistor cells of the cell array) W/L ratio of the channel width W to the channel length L of the transistor cells that are situated in at least one zone directly adjoining the selected sense zone having the current sensing device or temperature sensing device.

In one exemplary embodiment, a field effect power transistor according to the invention is characterized by the fact that the cell array is structured into a multiplicity of cell array strips. In the case of a field effect power transistor of this type, preferably, the gate electrodes are arranged within trenches introduced into a semiconductor body and the body and source electrode regions are arranged in the cell array strips lying between the trenches.

The temperature and/or current sensing devices are formed in a selected sense trench or a selected sense mesa, and the transistor cells having an increased W/L ratio lie in at least one cell array strip, adjacent to the sense trench or the sense mesa.

As stated, the W/L ratio of said transistor cells lying in cell array strips adjoining the sense trench is increased only slightly, for example by approximately 5% to 20%. Whereas, a W/L ratio of 1.5 to 1, for example, is present in the case of a customary field effect power transistor, the increased W/L ratio may be 1.75 to 1, for example.

In the case of application in linear controllers (SOA case), the cells with an increased W/L split earlier than those with a regular W/L formed in a large-area manner. In the avalanche case, too, the parasitic bipolar transistor triggers earlier with a larger body pinch zone below the $n^+$-type source, so that in both cases as it were the weakest cells have been deliberately produced and have been deliberately positioned directly in the vicinity of the sense trench or sense mesa containing the temperature or current sensing device. As a result, the temperature sensing device or current sensing device can react as quickly as possible to instances of potential splitting and turn off even before a splitting occurs in the large cell array. In order to position the temperature or current sensing device optimally with regard to its reaction speed, proximity to the gate terminal pad is preferable. However, since the chip edge is always at a somewhat lower temperature than the center of the cell array, a position which tends to be located toward the center of the cell array is expedient. In order to somewhat attenuate the reactions of the large cell array relative to the part with an increased W/L ratio, small resistors may optionally also be introduced into the gate leads.

In the case of a current sensing device, a FET transistor is situated in the sense trench or the sense mesa, and in the case of a temperature sensing device, the sense trench or the sense mesa has a diode, a bipolar transistor or a resistor.

The invention can be applied to all DMOS technologies (planar and trench). In the case of trench technologies with individual insulated trench strips, the structure according to the invention can be integrated relatively simply since rapidly reacting temperature or current sensing devices can be realized here. The sense trench provided with the temperature or current sensing device or the sense mesa and the adjacent cells are preferably arranged on the chip in zones in which the heating is greatest—as already mentioned, approximately in the center of the cell array. The number of adjacent cells with an increased W/L ratio is arbitrary, in principle, and the increase in the W/L ratio may vary and be increased to an extent such that an expedient (residual) avalanche strength still results (if this is actually required in the application; some applications are actively zenered and thus do not attain the avalanche case at all). The same principle can also be applied to current sensing devices that are used for turn-off. The current sensor would detect an increased current and likewise turn off earlier.

The description below of various exemplary embodiments of a field effect power transistor according to the invention relates by way of example to a DMOS structure which has a cell array comprising a multiplicity of strip-type transistor cells and in which gate electrodes are formed in trenches introduced into a semiconductor body and body and source electrode regions of the transistor cells are formed between the trenches. In this case, at least one particular sense trench in the semiconductor body that lies in or in proximity to the center of the cell array has a temperature or current sensing device. As already mentioned, the invention also encompasses, as an alternative to the temperature sensing device, a current sensing device, which is likewise formed in a selected sense trench in the cell array, but which is not illustrated and described in detail.

Figure 3:
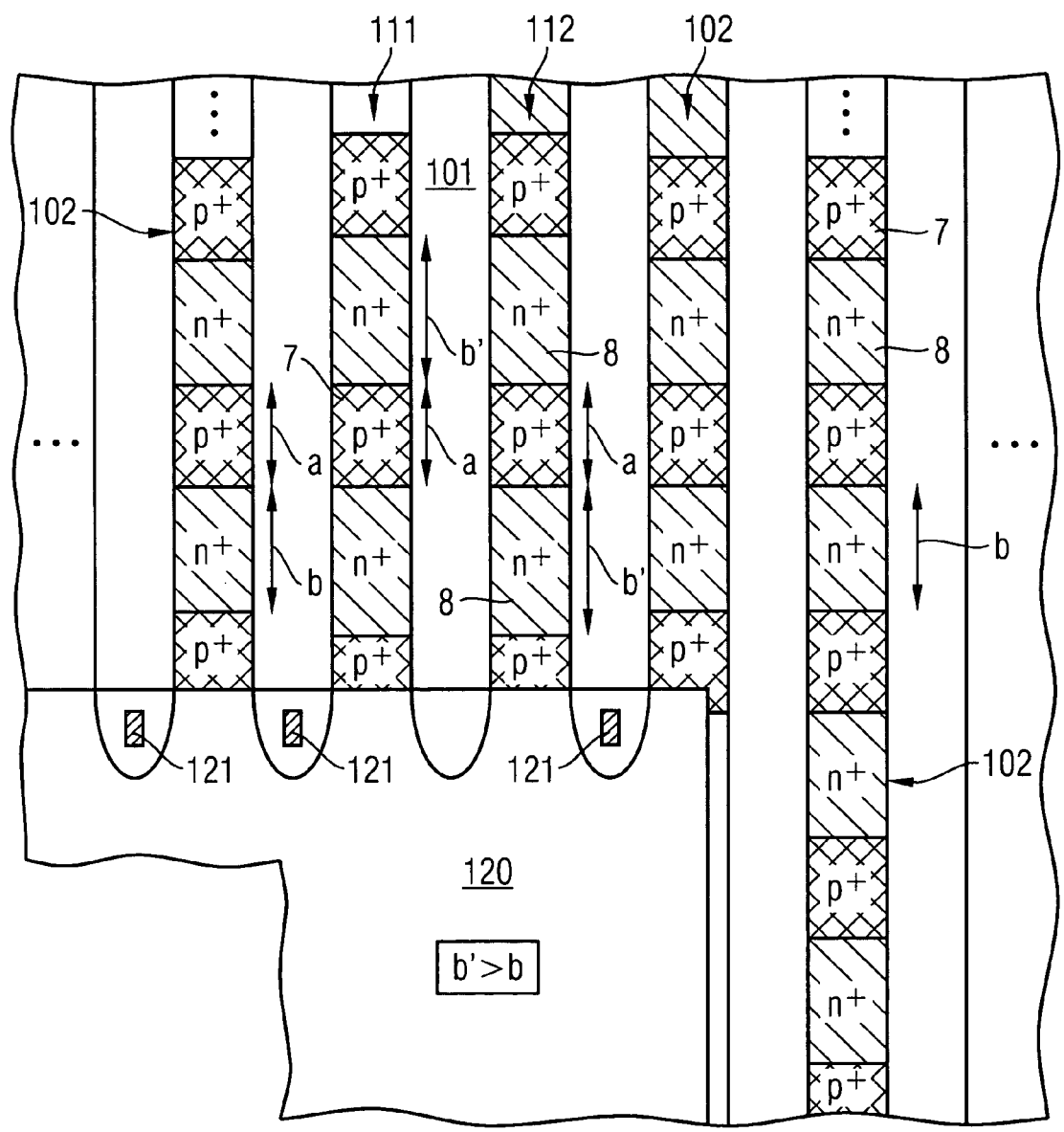
FIG. 3 illustrates a detail view of the framed region X in FIG. 1 in a schematic plan view.

In accordance with FIG. 1, which illustrates a schematic plan view of a cell array 110 of a first exemplary embodiment of a field effect power transistor, in particular DMOS transistor, the cell array 110 comprises a multiplicity of transistor cells which are arranged in parallel cell array strips 102, 111, 112 and the gate electrodes of which lie in trenches that likewise run parallel. Such field effect power transistors with a trench structure are known in the prior art. At least one particular trench 101, referred to as a sense trench, does not contain a gate electrode but rather has a temperature sensing device or current sensing device (not in FIG. 1). In accordance with FIG. 1, the sense trench 101 lies in proximity to the gate pad 120, but in a manner tending toward the center of the chip. A respective cell array strip 111, 112 adjacent to the sense trench 101 on the left and on the right has transistor cells with an increased W/L ratio of the channel width W to the channel length L, as will be explained in more detail below on the basis of the detail view of FIG. 3 illustrating the region X. In order to somewhat attenuate the reaction of the large cell array relative to the section with an increased W/L ratio, it is optionally possible, as illustrated in FIG. 1, for small resistors 122 also to be introduced into at least one gate lead of the transistor cells of the cell array that do not have an increased W/L ratio.

Figure 2:
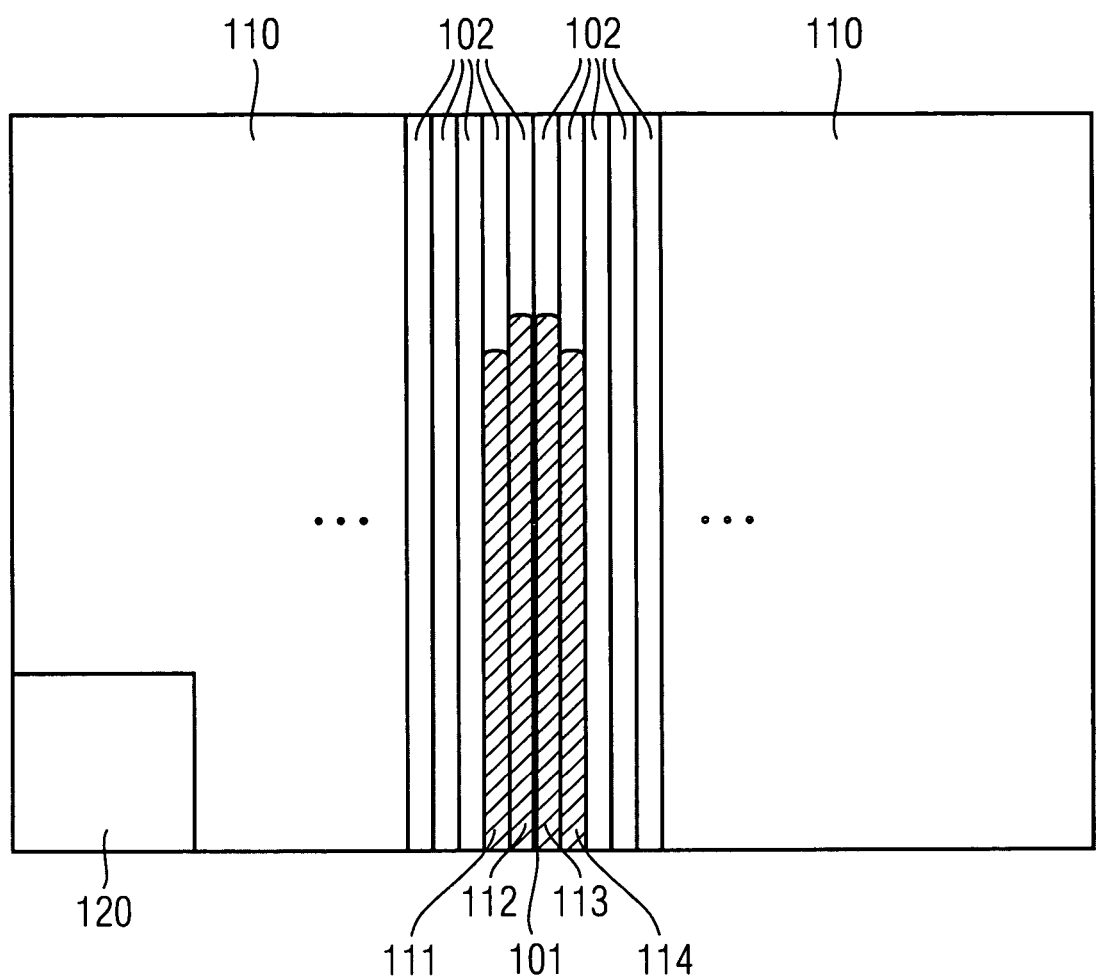
FIG. 2 schematically illustrates one embodiment of a plan view of a cell array of a field effect power transistor in which a temperature or current sensing device is arranged in a sense trench situated approximately in the center of the cell array and in which two cell array strips that are directly adjacent to said trench on the left and on the right are embodied with an increased W/L ratio.

In accordance with FIG. 2, which likewise illustrates a schematic plan view of the cell array 110 of a DMOS power transistor, by way of example, the sense trench 101 with the temperature sensing device or current sensing device is situated in proximity to the center of the chip. Two cell array strips 111, 112, 113 and 114 that are directly adjacent to the particular trench 101 on the left and on the right are embodied with an increased W/L ratio here, the sense trench 101 with the temperature sensing device or the current sensing device not running completely through the chip and the cell array strips whose transistor cells are equipped with an increased W/L ratio merging upward with normal cell array strips.

FIG. 3 illustrates a detail view of the small region X framed by a circle in FIG. 1. As can be seen, the cell array strips 111 and 112, the transistor cells of which have an increased W/L ratio compared with the normal transistor cells, are situated on the left and on the right of the sense trench 101 having the temperature sensing device or current sensing device. The length b of $n^+$-type zones 8 of normal transistor cells in the cell array strips 102 is less than the length b' of the $n^+$-type zones 8 in the cell array strips 111 and 112, with the result that b'>b. Incidentally, the length of the $p^+$-type zones 7, which is designated by a, does not change. The longer the $n^+$-type zone 8, that is to say the greater b' is, the greater the ratio W/L given a constant channel length L (not shown). It goes without saying that the W/L ratio can also be increased if the length of the $p^+$-type zones is reduced.

By way of example, the W/L ratio of the transistor cells that are directly adjacent to the sense trench 101 with the temperature sensing device or the current sensing device can be increased by between 5% and 20%. If, for example, a customary field effect power transistor has a W/L ratio of its channel width W to its channel length L of 1.5, the transistor cells in the strips 111, 112, 113, 114 may have a W/L ratio of 1.75.

In the case of the example illustrated in FIG. 3, in the transistor cells in the cell array strips 111 and 112, the length b' of the $n^+$-type zones 8 is approximately 20% greater than the length b of the $n^+$-type zones 8 in the normal cell array strips 102. FIG. 3 also illustrates that the gate electrodes (not illustrated) lying in the trenches (with the exception of the sense trench 101) are contact-connected by gate terminals 121 with the gate terminal pad 120. It goes without saying that it is also possible to provide more than one sense trench 101 with the directly adjoining cell array strips 111, 112, 113, 114.

The basic idea of the field effect power transistor illustrated above with reference to FIGS. 1 to 3 is to arrange, directly in the vicinity of a sense trench having the temperature sensing device or the current sensing device, a chain of transistor cells with an increased W/L ratio as it were as a "prewarning stage" which, in the case of current splitting effects, always split a short time earlier than potential current filaments in the cell array. As a result, the temperature or current sensing device lying in the directly adjacent sense trench is heated earlier and can therefore also turn off the field effect power transistor earlier, still before damage occurs in the cell array.

Figure 4A:
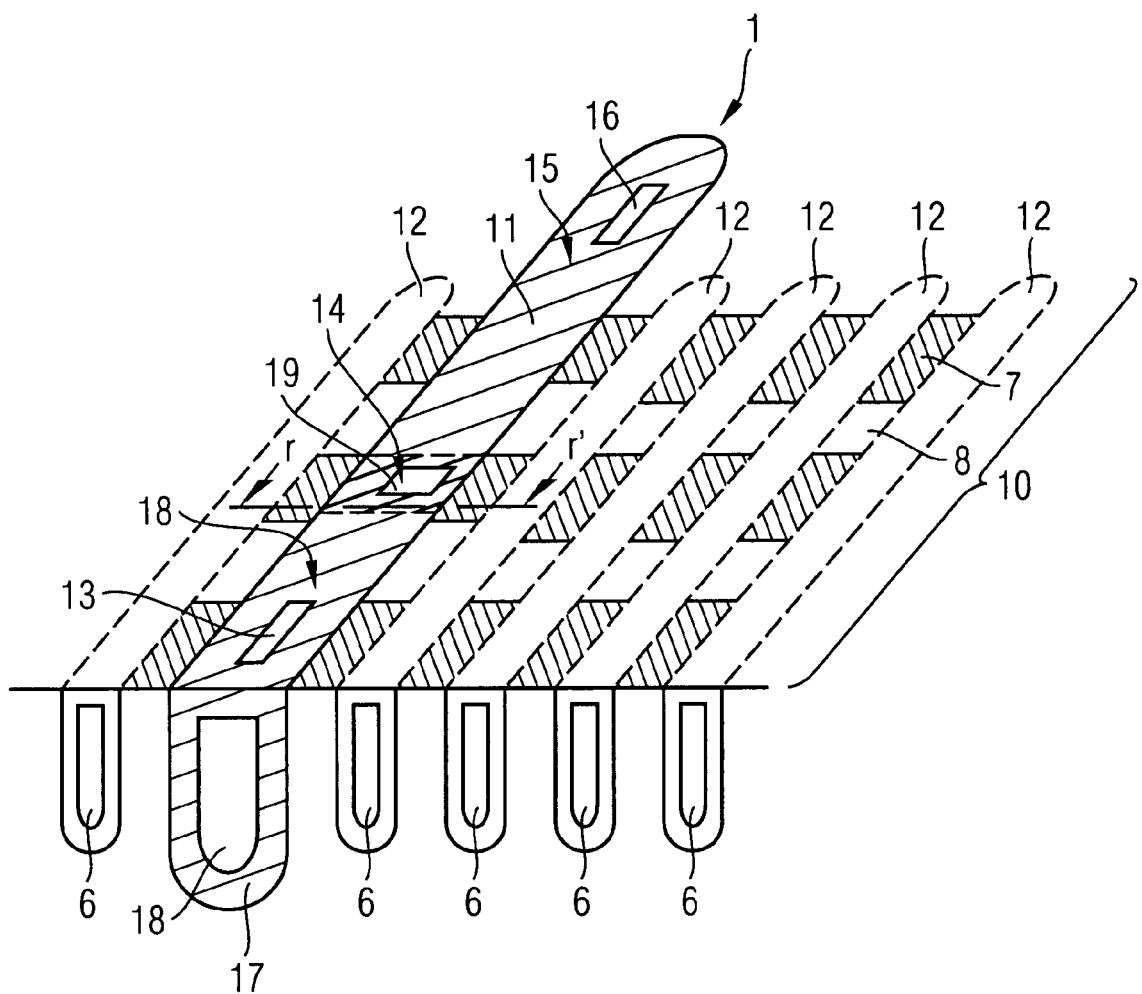
FIG. 4A illustrates a schematic oblique plan view of a first exemplary embodiment of a field effect power transistor in which a bipolar transistor is arranged as a temperature sensing device in a particular sense trench lying centrally in the cell array.

A number of exemplary embodiments of a temperature sensing device formed in the form of a bipolar transistor in the sense trench are explained below with reference to FIGS. 4A, 4B and 5 to 8. In FIG. 4A, which illustrates an oblique plan view of a section of a cell array designated by 10, a bipolar transistor 1 is formed in the depth of a sense trench 11, of which transistor a collector 18, a collector terminal 13, a base 14 and an emitter 15 with emitter terminal 16 are illustrated. Collector 18, base 14 and emitter 15 lie in this order in the longitudinal direction of the sense trench 11 and project into the depth of the sense trench 11. Apart from the collector terminal 13 and emitter terminal 16 and an optionally possible base terminal, all regions of the bipolar transistor 1 in the sense trench are insulated from the surroundings of the sense trench 11 by an oxide 17 of arbitrary thickness that surrounds them on all sides.

Gate electrodes 6 of the transistor cells are formed in the "normal" trenches 12 in the cell array 10. Body and source electrode regions 7, 8 of the normal cell array are strung together in strip-type fashion as in FIG. 3. The transistor cells of the cell array strips adjoining the selected sense trench on the left and on the right have an increased W/L ratio, as already explained. The trench 11 containing the bipolar transistor 1 may be arranged in the center of the cell array 10, as already explained. It goes without saying that, instead of one sense trench 11, it is also possible to provide a plurality of sense trenches 11 in the cell array 10.

The selected sense trench 11 may be embodied such that it is lengthened and/or widened at one or both ends for the purpose of contact-connecting the emitter/collector zones, more space then being available for the contact-connecting and wiring with metal. If the bipolar transistor 1 forming the temperature sensing device is an n-p-n transistor, a first n-type collector layer is firstly formed in the entire trench 11. By means of a resist covering before the section line r-r, the collector zone is protected during the subsequent p-type base implantation, for example with boron, at an inclination of 30° (directed forward, that is to say under the resist sidewall) and subsequent emitter implantation, for example As, at an inclination of −30° (directed rearward). Likewise, the cell array may be protected by means of the same resist phototechnique as required (if MOSFET-body=Base and MOSFET Source=emitter dopings are usable, it is necessary to cover only the collector part in the trench). A subsequent heat treatment would enable additional base width due to the faster diffusion of boron. The collector part may optionally be connected to MOSFET drain potential in the chip edge.

Figure 4B:
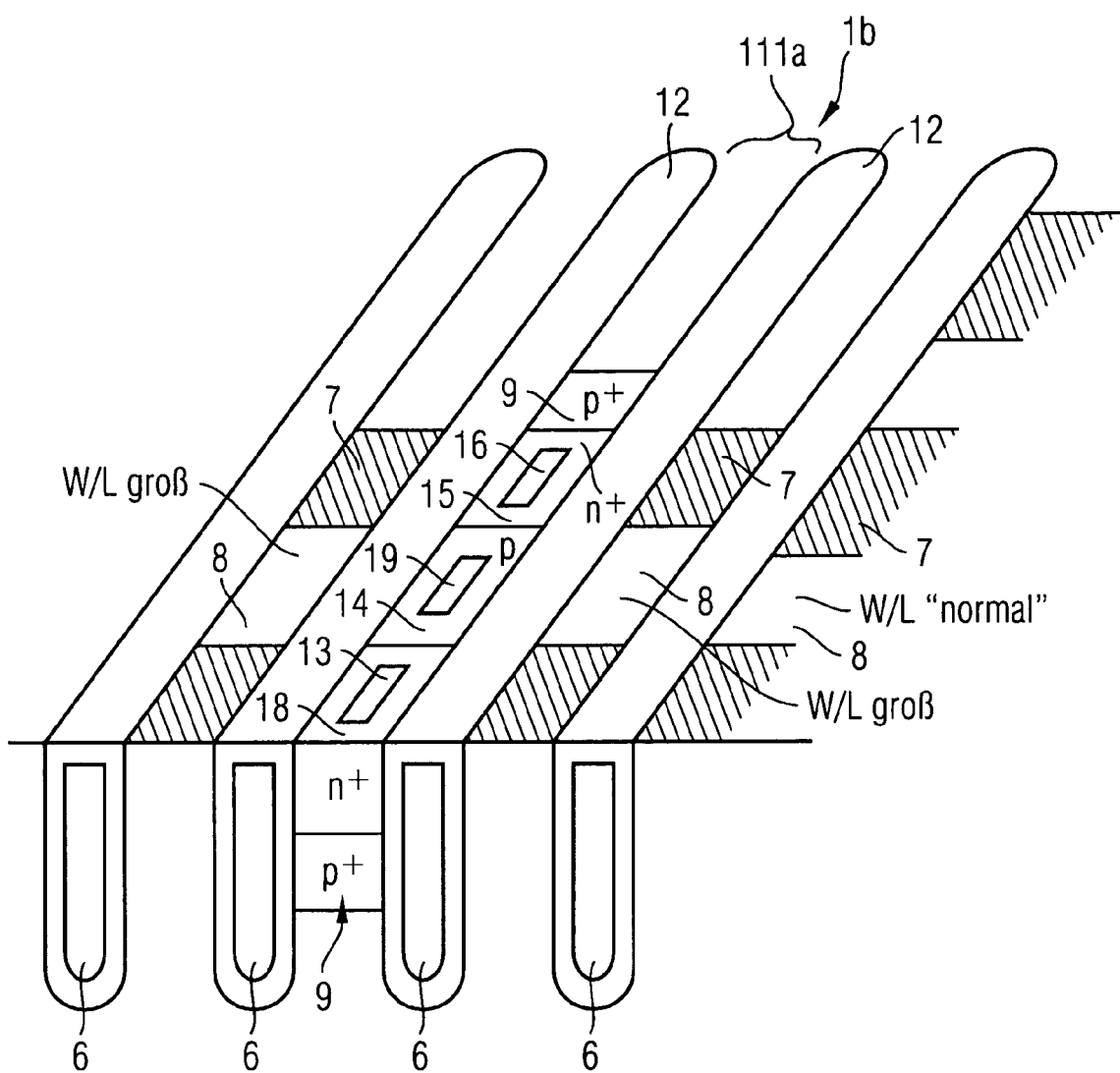
FIG. 4B illustrates a schematic oblique plan view of a variant of the first exemplary embodiment of the field effect power transistor in which a bipolar transistor serving as a temperature sensing device is arranged in a selected sense mesa lying centrally in the cell array.

In FIG. 4B, which illustrates an oblique plan view of a portion of a cell array of a variation of the exemplary embodiment shown in FIG. 4A, a bipolar transistor 1b serving as a temperature sensing device is formed in the depth of a mesa lying between two "normal" trenches 12, a so-called sense mesa 111a. In the example shown in FIG. 4B, the bipolar transistor 1b comprises a p-type base electrode 14, $n^+$-type emitter electrode 15 and $n^+$-type collector electrode 18. Said base, emitter and collector electrodes 14, 15 and 18 are insulated from the surroundings by a $p^+$-type shielding well 9 in the sense mesa 111a. The collector 18 has a collector terminal 13, the emitter 15 has an emitter terminal 16 and the base 14 has a base terminal 19. In a similar manner to that in the case of the exemplary embodiment shown in FIG. 4A, cell array strips with transistor cells with an increased W/L ratio are situated on the left and on the right next to the sense mesa but isolated from the latter by the trenches 12, while the transistor cells formed in the cell array strips lying further out have a "normal" W/L ratio.

Figure 5:
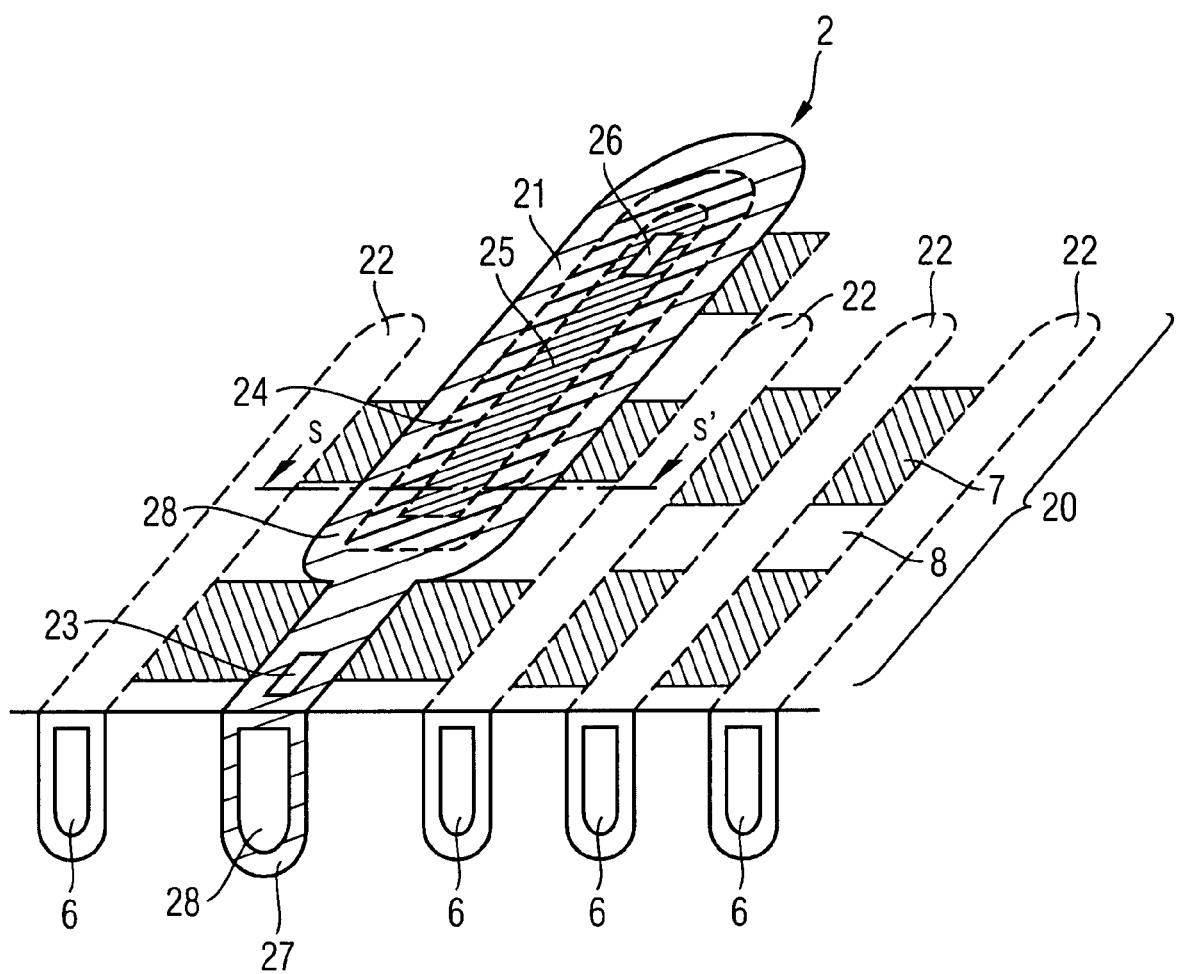
FIG. 5 illustrates a schematic oblique plan view of a second exemplary embodiment of a field effect power transistor with a temperature sensing device in the form of a bipolar transistor that is formed in a particular sense trench lying centrally in the cell array.

In accordance with the oblique plan view of a cell array designated by 20 as shown schematically in FIG. 5, a second exemplary embodiment B of a bipolar transistor, for example likewise an npn transistor, is formed in a selected sense trench 21, the collector, base and emitter electrodes of said transistor respectively being designated by 28, 24 and 25, the collector terminal of said transistor being designated by 23 and the emitter terminal of said transistor being designated by 26. The trenches of the cell array 20 that have gate electrodes 6 are designated by 22.

Figure 7:
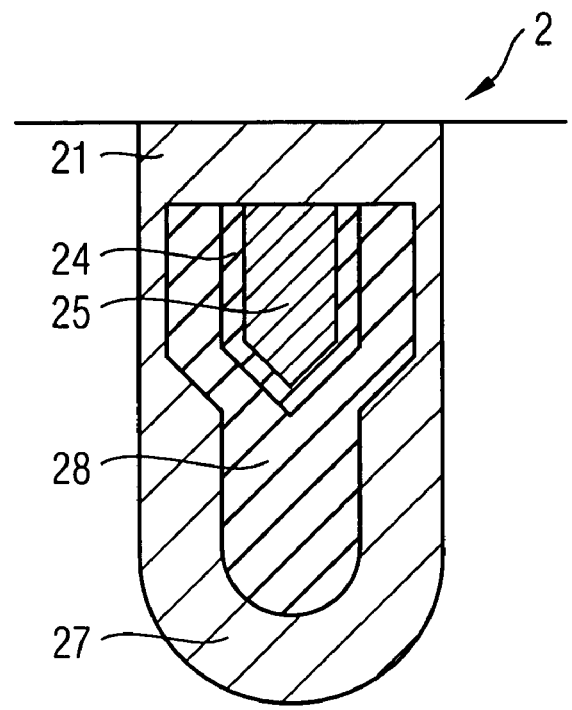
FIG. 7 schematically shows a cross section along the sectional plane S-S in FIG. 5.

The more detailed construction of the bipolar transistor 2 in the sense trench 21 is shown by the cross-sectional illustration in FIG. 7, which illustrates the structure of the temperature sensing device along the sectional plane S-S' from FIG. 5. The collector 28, the base 24 and the emitter 25 in the widened section of the sense trench 21 are stacked in this order one in the other and one above the other from the bottom to the top of the sense trench 21. This stack comprising collector 28, base 24 and emitter 25 is to be introduced into the sense trench 21 as conformally as possible. The widening of the sense trench 21 then leaves open the possibility of to what extent in the longitudinal direction of the sense trench the respective collector, base and emitter zones are formed.

Figure 6:
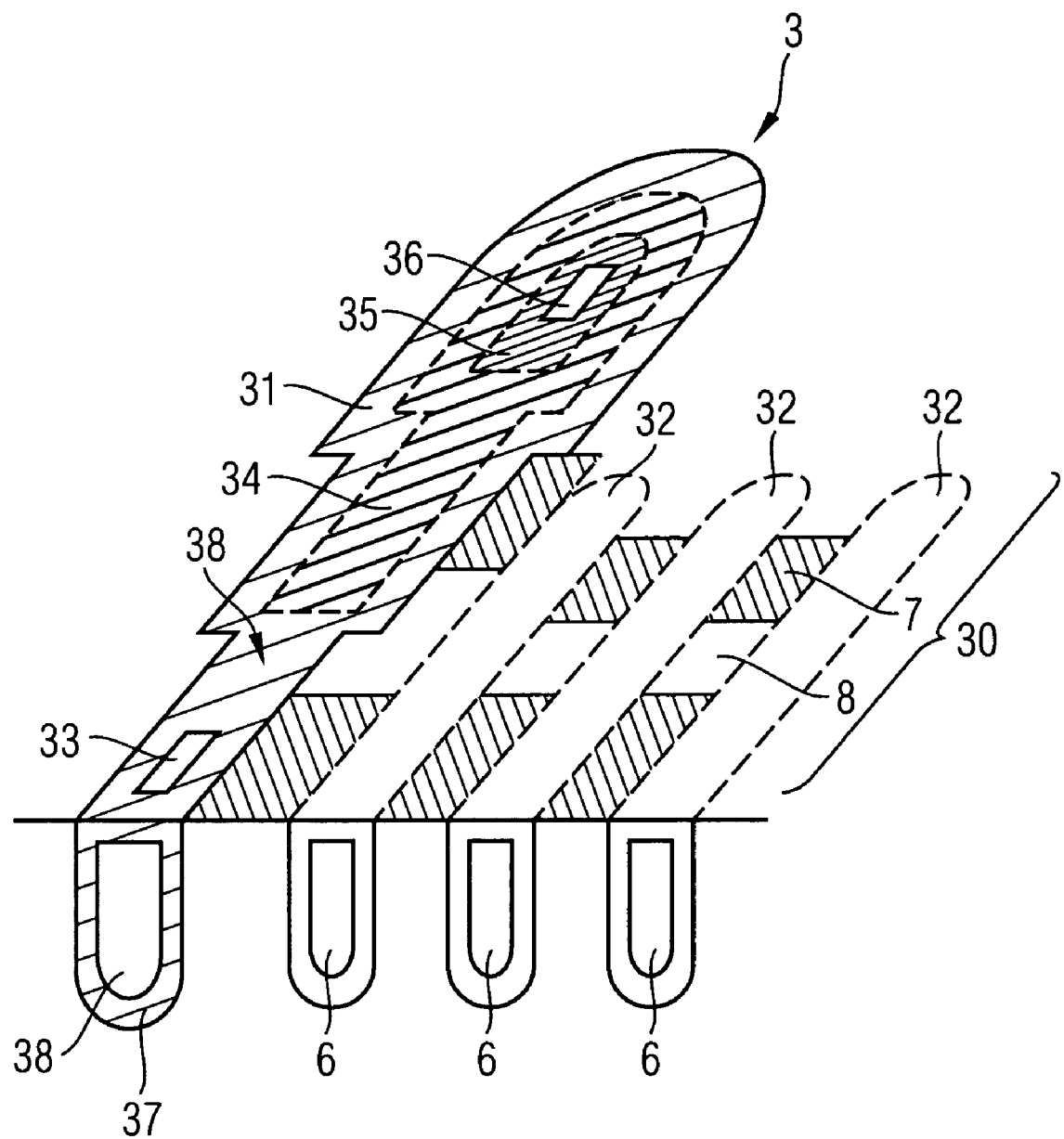
FIG. 6 illustrates a schematic oblique plan view of a third exemplary embodiment of a field effect power transistor with a temperature sensing device that is embodied in the form of a bipolar transistor formed in a particular sense trench centrally in the cell array.

In a third exemplary embodiment of a bipolar transistor 3 serving as a temperature sensing device as shown in FIG. 6, the collector 38, base 34 and emitter 35 of said transistor are stacked one in the other and one above the other from the bottom to the top in the widened section of the sense trench 31 likewise in accordance with FIG. 7. For the purpose of contact-connecting 36 the emitter 35, the sense trench 31 is significantly increased again in terms of its width or else length toward the end of the trench in order to enable reliable contact-connecting. The cell array is designated here by 30, the insulating oxide layer by 37 and the collector terminal by 38. The trenches having the gate electrodes are designated by 32.

Figure 8:
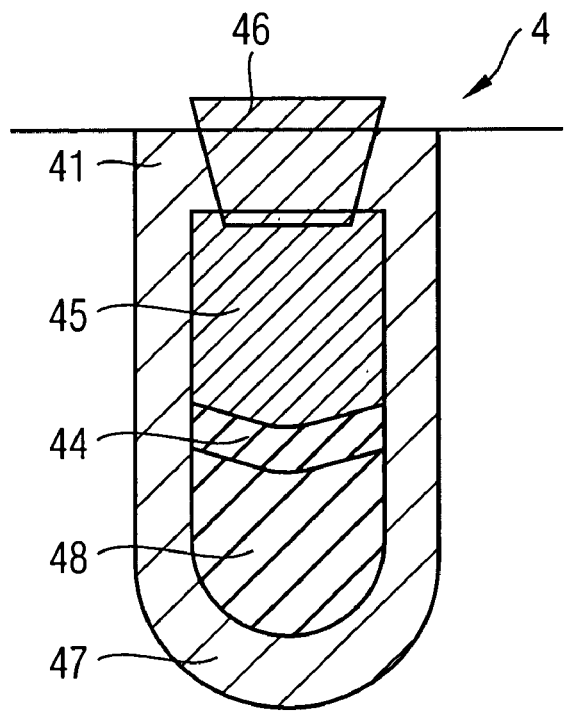
FIG. 8 illustrates a schematic sectional view of a fourth exemplary embodiment of a field effect power transistor with a temperature sensing device that is embodied as a bipolar transistor and is formed in a particular sense trench.

A fourth exemplary embodiment of a bipolar transistor 4 introduced into a sense trench 41 is shown by the cross-sectional view in FIG. 8. Here the various doping zones respectively of the collector 48, the base 44 and the emitter 45 are arranged one above the other in the sense trench 41. The individual electrode zones may optionally be contact-connected with a polysilicon or tungsten plug 46 by drawing out from the sense trench 41 or once again by varying the trench width (cf. with FIGS. 5 and 6) at the ends of the trench.

It should also be mentioned that, apart from the electrode contacts 13, 16 in FIGS. 4, 23, 26 in FIGS. 5, 33 and 36 in FIGS. 6 and 46 in FIG. 8 and the base electrode contacts that are optionally possible, all electrodes of the bipolar transistors 1, 2, 3 and 4 in the sense trench 11, 21, 31, 41 are insulated from the surroundings of the sense trench by oxide 17, 27, 37, 47 of arbitrary thickness.

The idea underlying the exemplary embodiments described above with reference to FIGS. 4 to 8 consists in creating a diode structure (not shown) or a bipolar transistor as a temperature sensing device in a sense trench which preferably runs centrally through the cell array of a field effect power transistor. In this case, it is possible, as described, to vary the implementation of the bipolar transistor and the form, width and length of the sense trench. It is likewise possible to provide more than one sense trench in the cell array.

In the exemplary embodiments illustrated in FIGS. 4 to 6, as described with reference to FIGS. 1 to 3, transistor cells with an increased W/L ratio are situated in the cell array strips directly adjoining the selected sense trench 11, 21, 31, 41.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A field effect power transistor having a cell array integrated in a semiconductor body, said cell array being structured into a multiplicity of cell array strips, said cell array strips comprising:

a plurality of transistor cells, each transistor cell having a body region and a source electrode region, and at least one zone of said cell array strips including transistor cells having an increased W/L ratio of their channel width (W) to their channel length (L) compared with the other transistor cells of the cell array strips; and at least one temperature sensing device formed in a selected sense zone within the at least one zone of the cell array strips which includes the transistor cells having said increased W/L ratio, wherein the sense zone includes a sense trench situated between two adjacent ones of the cell array strips including the transistor cells having an increased W/L ratio of their channel width (W) of their channel length (U compared with the other transistor cells of the cell array strips.

2. The transistor of claim 1, wherein the gate electrodes are arranged within trenches introduced into the semiconductor body, and the body region and the source electrode region of the transistor cells are arranged in the cell array strips lying between the trenches.

3. The transistor of claim 2, wherein the temperature sensing device is formed in a selected sense trench, and the transistor cells having an increased W/L ratio lie in at least one of the next following cell array strips at the left and/or right side of the sense trench.

4. The transistor of claim 1, wherein the W/L ratio is increased by approximately 5% to 20%.

5. The transistor of claim 3, wherein the at least one sense trench is positioned in the vicinity of a gate terminal pad.

6. The transistor of claim 3, wherein the at least one sense trench is positioned approximately in the center of the cell array.

7. The transistor of claim 1, wherein a resistor is provided in at least one gate lead of the transistor cells in order to set the reaction time of the temperature sensing device, and/or a current sensing device, with respect to that of the transistor cells.

8. The transistor of claim 1, wherein the temperature sensing device has a diode.

9. The transistor of claim 1, wherein the temperature sensing device has a resistor.

10. The transistor of claim 1, wherein the temperature sensing device is a current sensing device.

11. The transistor of claim 10, wherein the current sensing device has a FET transistor.

* * * * *